(12) United States Patent
Henri et al.

(10) Patent No.: US 8,034,725 B1
(45) Date of Patent: Oct. 11, 2011

(54) METHOD OF ELIMINATING SMALL BIN DEFECTS IN HIGH THROUGHPUT TEOS FILMS

(75) Inventors: Jon Henri, West Linn, OR (US); Xingyuan Tang, West Linn, OR (US); Jason Tian, West Linn, OR (US); Kevin Gerber, Portland, OR (US); Arul N. Dhas, Sherwood, OR (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 12/723,504

(22) Filed: Mar. 12, 2010

Related U.S. Application Data

(62) Division of application No. 11/602,564, filed on Nov. 20, 2006, now Pat. No. 7,704,894.

(51) Int. Cl.
*H01L 21/469* (2006.01)

(52) U.S. Cl. ........ 438/778; 438/591; 438/769; 438/783; 257/E21.3; 257/E21.158; 257/E21.576; 118/715; 118/723; 118/692

(58) Field of Classification Search ................. 438/778, 438/296, 591, 769, 783; 257/E21.3, E21.158, 257/E21.576; 118/715, 723, 692
See application file for complete search history.

(56) References Cited

U.S. PATENT DOCUMENTS

| | | | |
|---|---|---|---|
| 4,872,947 A | 10/1989 | Wang et al. | |
| 5,166,101 A | 11/1992 | Lee et al. | |
| 5,354,715 A | 10/1994 | Wang et al. | |
| 5,426,076 A | 6/1995 | Moghadam | |
| 5,518,959 A | 5/1996 | Jang et al. | |
| 5,674,783 A | 10/1997 | Jang et al. | |
| 6,530,380 B1 | 3/2003 | Zhou et al. | |
| 7,087,497 B2 | 8/2006 | Yuan et al. | |
| 7,704,894 B1 | 4/2010 | Henri et al. | |
| 7,923,376 B1 | 4/2011 | Dhas et al. | |
| 2003/0194493 A1 | 10/2003 | Chang et al. | |
| 2005/0196929 A1* | 9/2005 | Yuan et al. | 438/296 |
| 2009/0311857 A1* | 12/2009 | Todd et al. | 438/591 |

OTHER PUBLICATIONS

U.S. Office Action for U.S. Appl. No. 11/396,303 mailed Dec. 14, 2007.
U.S. Final Office Action for U.S. Appl. No. 11/396,303 mailed Aug. 8, 2008.
U.S. Office Action for U.S. Appl. No. 11/396,303 mailed Mar. 19, 2009.
U.S. Final Office Action for U.S. Appl. No. 11/396,303 mailed Oct. 28, 2009.
U.S. Office Action for U.S. Appl. No. 11/396,303 mailed Jan. 29, 2010.

(Continued)

*Primary Examiner* — Matthew Smith
*Assistant Examiner* — Wilner Jean Baptiste
(74) *Attorney, Agent, or Firm* — Weaver Austin Villeneuve & Sampson LLP

(57) ABSTRACT

This invention provides a high throughput PECVD process for depositing TEOS films in a multi-station sequential deposition chamber. The methods significantly reduce the number of particles in the TEOS films, thereby eliminating or minimizing small bin defects. The methods of the invention involve dedicating a first station for temperature soak while flowing purge gas. Stopping the flow of reactant gas and flowing the purge gas for station 1 eliminates TEOS condensation on a cold wafer surface and significantly reduces the number of defects in the film, particularly for short temperature soaks.

13 Claims, 5 Drawing Sheets

OTHER PUBLICATIONS

U.S. Office Action for U.S. Appl. No. 11/602,564 mailed Feb. 15, 2008.

U.S. Final Office Action for U.S. Appl. No. 11/602,564 mailed Sep. 4, 2008.

U.S. Office Action for U.S. Appl. No. 11/602,564 mailed Mar. 20, 2009.

Notice of Allowance for U.S. Appl. No. 11/602,564 mailed Dec. 14, 2009.

U.S. Appl. No. 11/396,303, Office Action mailed Jul. 16, 2010.

U.S. Appl. No. 11/396,303, Notice of Allowance mailed Dec. 8, 2010.

* cited by examiner

METHOD OF ELIMINATING SMALL BIN DEFECTS IN HIGH THROUGHPUT TEOS FILMS

CROSS-REFERENCE TO RELATED APPLICATION

This application is a continuation of and claims priority from U.S. patent application Ser. No. 11/602,564, filed Nov. 20, 2006, titled "METHOD OF ELIMINATING SMALL BIN DEFECTS IN HIGH THROUGHPUT TEOS FILMS," which is incorporated by reference in its entirety.

FIELD OF THE INVENTION

The present invention pertains to methods for depositing dielectric film on a substrate. More specifically, the invention pertains to high throughput PECVD TEOS processes. The invention is effective at eliminating small bin defects in thin PECVD TEOS films.

BACKGROUND

TEOS (tetra-ethyl-ortho-silicate) is a silicon-containing compound that is a liquid at room temperature. TEOS is used in many applications to deposit dielectric film on a substrate. TEOS is used in applications where conformality is required as silicon dioxide (or "TEOS oxide") films deposited by TEOS chemical vapor deposition processes have good conformality. TEOS oxide is often deposited by a plasma enhanced deposition chemical vapor deposition (PECVD) process. TEOS-based PECVD processes typically involve exposing a substrate to a process gas including TEOS and an oxidant such as oxygen or ozone. Liquid TEOS is first vaporized in a preheater to about 150 degrees Celsius. TEOS vapor flows first to a "mixing bowl" in the deposition chamber, then to the individual showerheads in each station—if a multi-station chamber is used.

In a Multi-station Sequential Deposition (MSSD) system, the wafer spends equal amount of time at each of multiple stations. As an example, at each station, the wafer experiences more or less the same process as follows: the wafer is heated on the pedestal with helium purge; some oxygen flows into the station out of the showerhead; the precursor gas flows out of the showerhead with some oxidant gas; plasma is struck; a dielectric film is deposited onto the wafer; the precursor gas is turned off; then a few second later, the oxidant gas and the plasma are turned off; and lastly, the wafer advances to the next station. Gases flow to the showerheads from a mixing bowl. Every station receives the same gases.

To improve the throughput, the first station may be dedicated to heating the wafer, commonly known as the temperature soak step. This reduces the time a wafer spends at each station by eliminating the initial temperature soak step from each station. The wafer is thereby heated at the first station for about the length of time the other stations run their processes. Because the wafer does not lose much heat between stations, the temperature soak only needs to be performed once. Therefore, more wafers per hour can run through the system because each wafer spends less time in the system. Of course, the oxide that would have been deposited at the first station must now be deposited at other stations.

As throughput increases and film thickness decreases, the amount of time at each station also decreases. Not only is deposition time decreased, but also the temperature soak time. At very short temperature soak times, the wafer is not heated long enough to reach a high temperature, resulting in small bin defects. FIG. 1 shows the relationship between defect level on the y-axis, shown as particle adders with SiN Cap, and soak time/wafer temperature. In the particular experiment used to generate the data in FIG. 1, SiN is deposited on wafers to magnify small bin defects for optical detection. Because SiN has poor conformal properties, when deposited on a wafer it highlights defects that ordinarily may not have been visible by some optical detection methods.

As soak time increases, defects of all sizes decrease, but the smallest defects are most sensitive to soak time. Small bin defects are those smaller than 0.16 microns. As device size shrinks to 65 nanometers and below, small bin size defects can greatly reduce yield. Even more yield problems can arise as the number of integration layers increase; the upper layers magnify small bin defects from lower layers to become large bin defects.

Because small bin defects are strongly correlated to wafer temperature, one solution is to lengthen the temperature soak time. The wafer would reach a high temperature, and the small bin defects would be eliminated. However, the advantage of high throughput would be lost. What are needed therefore are improved methods for depositing thin TEOS films at high throughput without small bin defects and without sacrificing the film quality.

SUMMARY OF THE INVENTION

The present invention meets these needs by providing a high throughput PECVD process for depositing TEOS films in a multi-station sequential deposition chamber. In many embodiments, the methods significantly reduce the number of particles in the TEOS films, thereby eliminating or minimizing small bin defects. An example method involves dedicating a first station for temperature soak while flowing purge gas. Stopping the flow of reactant gas and flowing the purge gas for station 1 may eliminate TEOS condensation on a cold wafer surface and significantly reduce the number of defects in the film, particularly for short temperature soaks.

One aspect of the invention relates to a high throughput PECVD method of forming a dielectric material in a multi-station sequential deposition (MSSD) chamber involving introducing a semiconductor substrate to a first station of the deposition chamber, heating the semiconductor substrate in the first station while flowing a purge gas over the substrate, moving the semiconductor substrate from the first station to a second station, flowing the reactant process gas onto the semiconductor substrate to cause deposition of dielectric material in the second station, moving the wafer one or more additional times, and removing the wafer from the deposition chamber. While heating the substrate in the first station, the flowing purge gas is substantially free of a reactant process gas being delivered in one or more other stations of the deposition chamber.

According to various embodiments, the purge gas may flow continuously in station 1, during temperature soak and wafer transfer. The heating step in the first station while flowing purge gas may last between 3 and 15 seconds. In a MSSD chamber, simultaneous processing takes place on different stations. The heating step in the first station is normally performed while other stations are deposition dielectric material. Even if the heating step is performed in station 1 as described, a short heating step with purge gas may still be performed in the other chambers before deposition.

In one embodiment, plasma may be ignited in one or more other stations for depositing dielectric material without igniting plasma in the first station. In another embodiment, plasma may be ignited in the first station to increase heat transfer to the wafer or to provide a plasma pretreatment to increase film adhesion. In certain embodiments, after the deposition step is complete, the reactant process gas stops but the plasma and oxygen may continue to flow in order to burn off any residual reactants.

In certain embodiments, the preferred purge gas is Argon. Other purge gas such as oxygen, ozone, helium, and nitrogen can also be used to practice this invention. Any process using reactant process gas likely to condense on a cold wafer may benefit from this invention. Possible reactant process gases include TEOS, cyclic and non-cyclic TEOS variants such as tetramethoxysilane (TMOS), fluorotriethoxysilane (FTES), Trimethylsilane (TMS), octamethyltetracyclosiloxane (OMCTS), tetramethylcyclotetrasiloxane (TMCTSO), dimethyldimethoxysilane (DMDS), hexamethyldisilazane (HMDS), hexamethyldisiloxane (HMDSO), hexamethylcyclotrisiloxane (HMCTSO), dimethyldiethoxysilane (DMDEOS), methyltrimethoxysilane (MTMOS), tetramethyldisiloxane (TMDSO), divinyltetramethyldisiloxane (VSI2), methyltriethoxysilane (MTEOS), dimethyltetramethoxydisiloxane (DMTMODSO), ethyltriethoxysilane (ETEOS), ethyltrimethoxysilane (ETMOS), hexamethoxydisilane (HMODS), bis(triehtoxysilyl)ethane (BTEOSE), bis (trimethoxysilyl)ethane (BTMOS E), dimethylethoxysilane (DMEOS), tetraethoxydimethyldisiloxane (TEODMDSO), tetrakis(trimehtylsiloxy)silane (TTMSOS), tetramethyldiethoxydisiloxane (TMDEODSO), triethoxysilane (TIEOS), trimethoxysilane (TIMEOS), or tetrapropoxysilane (TPOS).

Another aspect of the invention relates to the apparatus for performing high throughput PECVD methods such as the one described above. In certain embodiments, the apparatus includes a first station for heat soaking the semiconductor substrate without depositing the material; one or more additional stations for depositing the material on the semiconductor substrate; and a controller including instructions for (1) introducing the semiconductor substrate to a first station of the deposition chamber; (2) heating the semiconductor substrate in the first station while flowing a purge gas over the substrate, where the purge gas is substantially free of a reactant process gas being delivered in other stations of the deposition chamber; (3) moving the semiconductor substrate from the first station to a second station; (4) flowing the reactant process gas onto the semiconductor substrate while positioned in the second station, thereby depositing the material on the semiconductor substrate; (5) moving the wafer one or more additional times; and (6) removing the wafer from the deposition chamber.

Another aspect of the invention relates to the mechanism for delivering gas to the stations comprising a mixing bowl connected to a showerhead at each station and the gas source. A plasma source is also connected to the showerheads that also act as an electrode for generating the plasma. For station 1, an isolation valve is located between the showerhead and the mixing bowl to cut off the reactant process gas flow. A control valve is connected between a purge gas source and a gas line between the isolation valve and the showerhead at station 1. The controller includes instructions to control both valves to flow only purge gas during station 1 heating step.

In another embodiment, a three-way valve is connected between the showerhead of station 1, the mixing bowl, and the purge gas source. The controller includes instructions to control the three-way valve to flow only purge gas during station 1 heating step.

In another embodiment, the controller is configured to provide instructions for simultaneously performing the heating in the first station and the depositing at the other stations on different semiconductor substrates. The controller may also be configured to instruct the apparatus to flow purge gas in one or more other stations for a period of no more than about 3 seconds while flowing the purge gas over the substrate in the first station. Additionally, the controller may also provide instructions to ignite a plasma in one or more other stations without igniting a plasma in the first station. Or the controller may provide instructions to ignite a plasma in every station, but in station 1 for the purpose of heating the wafer or preparing the wafer surface, not to cause chemical deposition as in the other stations.

In another embodiment, the controller may contain instructions to stop the flow of reactant process gas before extinguishing the plasma and oxygen flow to burn off the residual reactant process gas at the station.

These and other features and advantages of the invention will be described in more detail below with reference to the associated drawings.

DETAILED DESCRIPTION OF SPECIFIC EMBODIMENTS

Introduction

Figure 1:
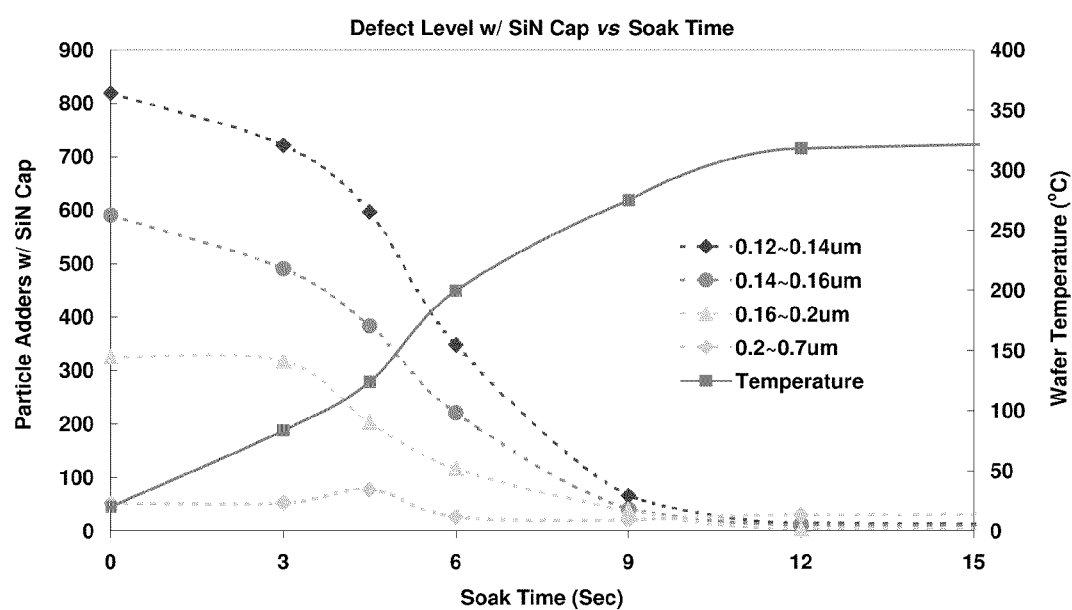
FIG. 1 is a graph showing the number of defects by size versus temperature soak time and wafer temperature.

In the following detailed description of the present invention, numerous specific embodiments are set forth in order to provide a thorough understanding of the invention. However, as will be apparent to those skilled in the art, the present invention may be practiced without these specific details or by using alternate elements or processes. In other instances well-known processes, procedures and components have not been described in detail so as not to unnecessarily obscure aspects of the present invention.

In this application, the terms "substrate" and "wafer" will be used interchangeably. The following detailed description assumes the invention is implemented on a semiconductor wafer. However, the invention is not so limited. The work piece may be of various shapes, sizes, and materials. In addition to semiconductor wafers, other work pieces that may take advantage of this invention include various articles such as display front planes printed circuit boards and the like.

Tetra-ethyl-ortho-silicate (also called tetraethoxysilane or just "TEOS") is a silicon-containing compound that is a liquid at room temperature and that is used in many applications to deposit silicate films on semiconductor wafers. TEOS is often used in place of silane for applications that require good conformality, for example, when the wafer surface contains recessed features or other irregularities.

Silicon dioxide films deposited using TEOS (also called TEOS oxide films or TEOS films) may be deposited by thermal or plasma-enhanced chemical vapor deposition processes using a process gas containing TEOS and an oxidant, typically oxygen or ozone. The methods of the present invention involve plasma enhanced chemical vapor deposition (PECVD) processes.

In a Multi-station Sequential Deposition (MSSD) system, the wafer spends equal amount of time at each station. At each station, in some examples of a TEOS process, the wafer experiences more or less the same process as follows: temperature soak where the wafer is heated on the pedestal with an inert gas purge; some oxygen flows into the station out of the showerhead; the precursor gas flows out of the showerhead with some oxidant gas; plasma is struck; a dielectric film is deposited onto the wafer; the precursor gas is turned off; then a few second later, the oxidant gas and the plasma are turned off; and lastly, the wafer advances to the next station. Gases flow to the showerheads from a mixing bowl. Every station receives the same gases.

Known processes for deposition TEOS have low throughput, resulting in less wafers run per hour. It would be desirable to have high throughput PECVD process with good film quality. Because a temperature soak step is performed at every station, a way to improve throughput is to dedicate station 1 for the temperature soak step, thus decreasing the duration the wafer spends at each station. As the wafers are indexed throughout the system in less time, more wafers can run through the system, resulting in higher throughput.

As throughput increases, the length of time each wafer stays at each station also decreases, including the station 1 temperature soak. For a very short temperature soak, the wafer is not heated long enough to reach a high temperature, resulting in the noted increase in small bin defects. According to one theory, a recombination of dispersed TEOS generates small bin defects found during SiN capping decoration test. During temperature soak, TEOS came out of station 1 showerhead as well as other station showerheads. The TEOS from station 1 showerhead recombines with more dispersed TEOS and condensed onto the cold wafer. After a long temperature soak when the wafer comes hotter, the condensed TEOS is vaporized or becomes easily ionized by the plasma. FIG. 1 shows the relationship between defect level on the y-axis, shown as particle adders, and soak time/wafer temperature. FIG. 1 shows more than 800 particle adders for the smallest particles, 0.12-0.14 microns for no temperature soak. At the temperature soak time increases, the wafer temperature increases, to reach steady state in about 12 seconds at about 320 degrees Celsius. As the soak time increases, the particles also decrease, to less than 100 particle adders at 9 seconds. However, even 9 seconds is too long for the high throughput requirements for some thin dielectric films, and due to shrinking device size, less than 100 particles adders is still too high to meet current defect requirements. In some examples, it is desirable to achieve throughput of greater than 80 wafers per hour, preferably 90 wafers per hour, for a 300-angstrom film, eliminate most small bin defects, reduce particle adders greater than 0.16 micron to less than 30, and to achieve a within wafer non-uniformity of less than one percent.

Figure 2:
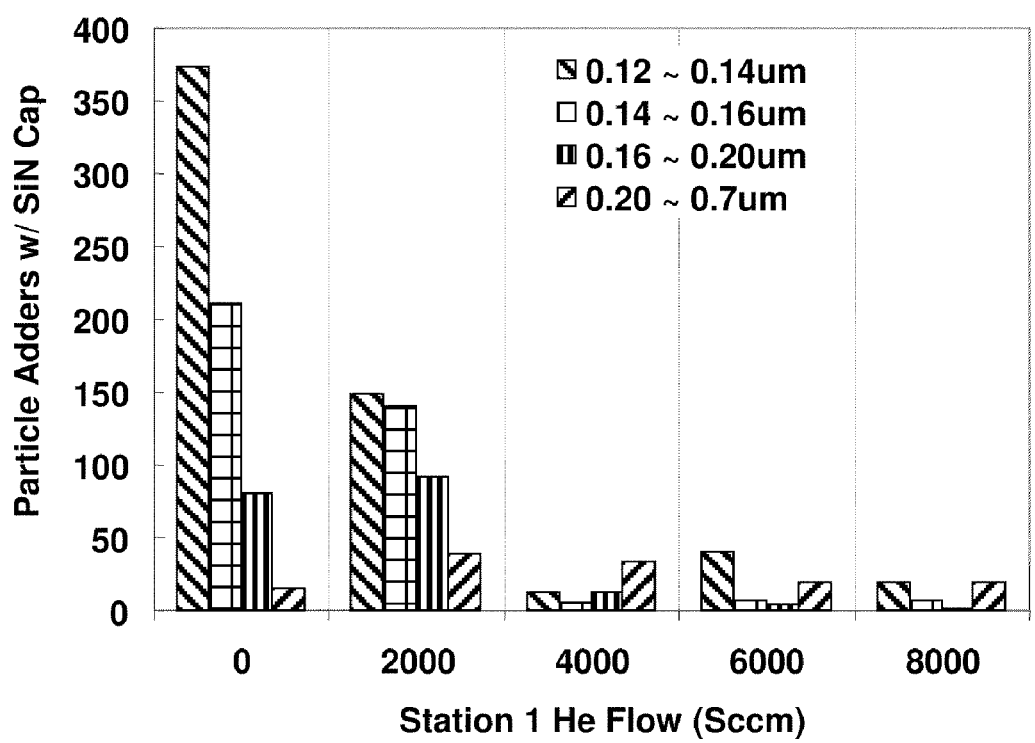
FIG. 2 is a graph showing defect performance without purge gas and with helium purge gas at various flow rates.

Defects in the deposited film are typically the results of particles being incorporated into the film during deposition. For example, particles may be formed by unreacted reactant gases or condensation on the wafer surface, especially when wafer is cold at station 1. An experiment using helium gas as the purge gas was conducted. FIG. 2 shows the number of defects relative to helium purge gas injection at station 1. With no helium purge gas or little helium gas, the numbers of defects are high, with over 350 particle adders for the 0.12-14 micron range. The defects decrease to almost noise level, less than 25 or so, at helium flow rates above 4000 standard cubic centimeter per minute (sccm). Therefore, eliminating TEOS input and introducing a purge gas at station 1 significantly reduce the number of defects in the deposited TEOS film.

As indicated above, the wafer is not heated long enough to reach a high temperature, resulting in TEOS coming out of station 1 showerhead recombining more dispersed TEOS on cold wafer on station 1. Once TEOS is recombined on the cold wafer, subsequent plasma may not supply enough reaction energy to ionize the TEOS on the wafer, resulting in the unreacted and partially reacted TEOS byproducts being incorporated into the film. Although it is believed that preventing the TEOS recombination reduces defects in deposited films, the invention is not limited to any particular mechanism.

One skilled in the art will recognize that this invention may apply to any liquid precursor likely to condense on a cold wafer, in addition to TEOS and TEOS variants. Likely precursor candidates include tetramethoxysilane (TMOS), fluorotriethoxysilane (FTES), trimethylsilane (TMS), octamethyltetracyclosiloxane (OMCTS), tetramethylcyclotetrasiloxane (TMCTSO), dimethyldimethoxysilane (DMDS), hexamethyldisilazane (HMDS), hexamethyldisiloxane (HMDSO), hexamethylcyclotrisiloxane (HMCTSO), dimethyldiethoxysilane (DMDEOS), methyltrimethoxysilane (MTMOS), tetramethyldisiloxane (TMDSO), divinyltetramethyldisiloxane (VSI2), methyltriethoxysilane (MTEOS), dimethyltetramethoxydisiloxane (DMTMODSO), ethyltriethoxysilane (ETEOS), ethyltrimethoxysilane (ETMOS), hexamethoxydisilane (HMODS), bis(triehtoxysilyl)ethane (BTEOSE), bis(trimethoxysilyl)ethane (BTMOSE), dimethylethoxysilane (DMEOS), tetraethoxydimethyldisiloxane (TEODMDSO), tetrakis(trimehtylsiloxy)silane (TTMSOS), tetramethyldiethoxydisiloxane (TMDEODSO), triethoxysilane (TIEOS), trimethoxysilane (TIMEOS), or tetrapropoxysilane (TPOS). In general, other likely precursor candidates include various liquid siloxanes (linear and cyclic) and silanes.

Process

Figure 3:
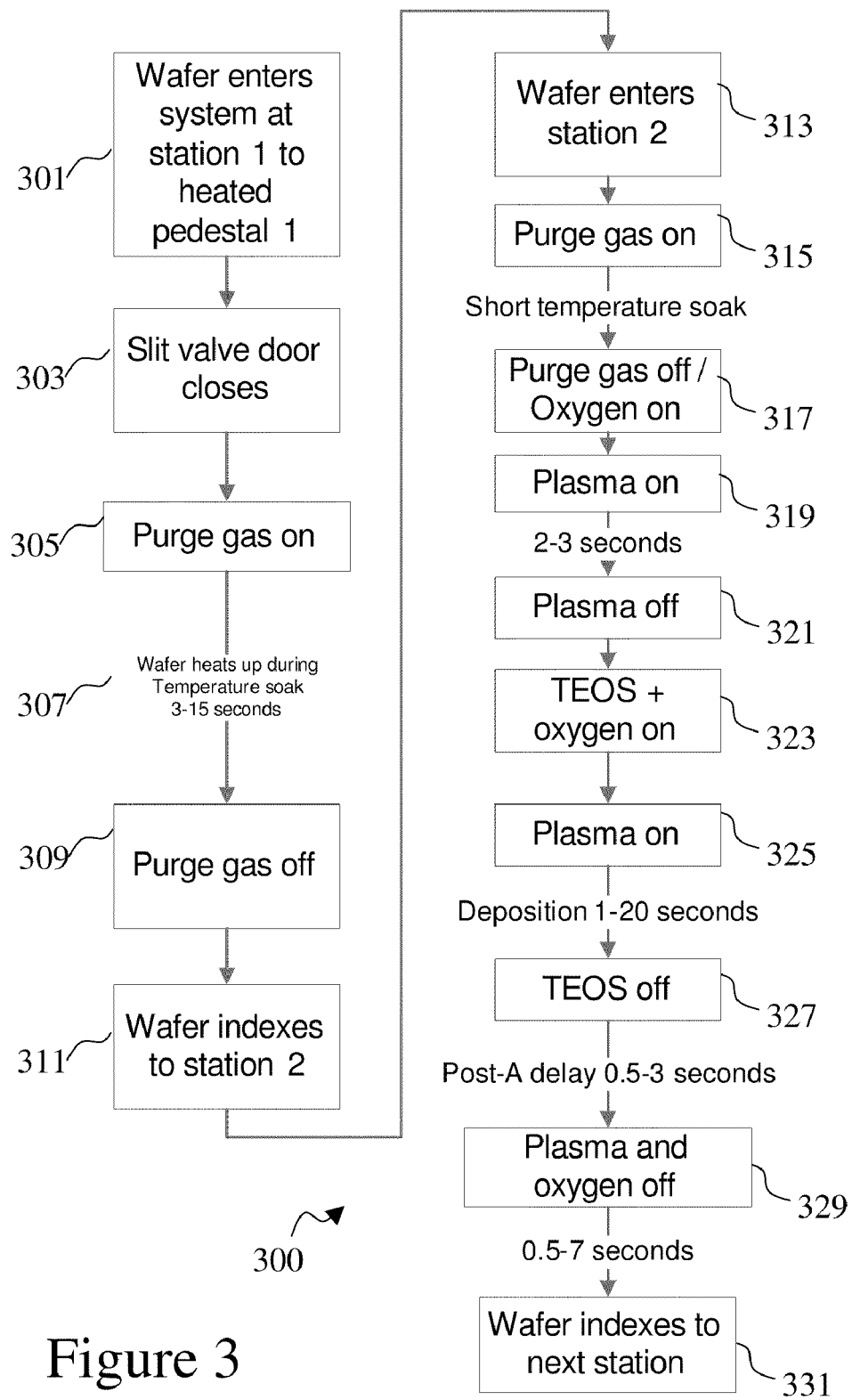
FIG. 3 is a process flow diagram illustrating aspects of some embodiments of the invention employed for depositing a TEOS oxide film on a substrate.

FIG. 3 is a flow chart depicting one specific high-level process flow in accordance with some embodiments of the present invention. The process (300) begins when a wafer enters the system at station 1 to a heated pedestal (301). The substrate is typically a semiconductor wafer that may contain partially fabricated integrated circuits or other devices. Typically, it will contain one or more layers, e.g. dielectric or conductive layers, deposited on it depending on the application. A slit valve (as one example) from which the wafer enters the system closes (303), and a purge gas turns on (305). The purge gas can be, for example, oxygen, ozone, argon, helium, carbon dioxide, nitrous oxide or nitrogen, or a combination of these gases. The purge gas is substantially free of the reactant process gas being delivered in one or more other stations of the deposition chamber.

The wafer heats up on the hot pedestal, which is usually heated to at least about 100 degrees Celsius in particular embodiments, more commonly to at least about 400 degrees Celsius, and in some instances, to about 600 degrees Celsius. The duration of temperature soak is dependent on the process sequence in the other stations, where film deposition is ongoing. The temperature soak process at station 1 happens concurrently with the deposition at other stations. Therefore the total time spent on station 1 for temperature soak depends on the process time in other stations. The temperature soak time may be between 4 and 600 seconds, preferably between 6 and 30 seconds.

However, the total time in station 1 could include a soak time portion during which no TEOS is flowing at other stations. This soak time without TEOS flow is sometimes needed to ramp up wafer temperature to a certain level before TEOS on at the other stations. Temperature soak (before TEOS turn on in the other stations) can last any where between about 0 to 300 seconds, preferably between about 0 and 6 seconds to maximize the throughput.

At the end of temperature soak, purge gas is still on but flow is reduced for wafer indexing, or it may be turned off (309) and the wafer indexes to station 2 (311). In some instances, the station 1 purge gas remains on all the time without reduction, even as the wafer indexes to station 2. In another embodiment, plasma may be ignited at station 1 during temperature soak to increase the heat transfer to the wafer. At the end of the temperature soak, the wafer may or may not have reached a steady-state temperature. If the temperature soak step is short, the wafer may still be cold relative to the pedestal, but any recombination of dispersed TEOS on station 1 cold wafer is minimized because the station 1 purge gas remains on to minimize the diffusion of TEOS vapor from the other stations to station 1. The wafer temperature will continue to increase in station 2.

Note that as the wafers index to the next station, the process experienced by the wafer at the next station may be different from the one in the previous station. In a multi-station sequential processing reactor, each station may run a different process while its neighbor performs another process. After the wafer enters stations 2 (313), a new wafer enters station 1 and the process described above repeats at station 1 for the new wafer. In the meantime, the wafer that occupies station 2 is now experiencing TEOS deposition at station 2 after it is heated up at station 1, and the wafer that previously occupies station 2 is now at station 3.

At station 2, a very short temperature soak may be initiated with a purge gas cycle (315 and 317). As the purge gas turns off, oxidant gas such as oxygen or ozone starts to flow (317). In some cases, plasma may come on briefly (319), for two or three seconds and then be turned off (321) before the reactant process gas, such as TEOS, starts to flow (323). Alternatively, oxidant and TEOS might co-flow for a certain time. The plasma then ignites (325) where the reactant process gas and oxygen ionize and cause deposition of dielectric film on the wafer surface. This deposition may last between about 1 to 20 seconds, depending on the rate of deposition and thickness of film required. At the end of the process sequence for station 2, the wafer is indexed again, and the station 2 process repeats on the new wafer.

For the high throughput PECVD process, film thickness of between about 100 and 1000 angstroms total from all the stations is typical, preferably between about 100 and 500 angstroms, with deposition time between about 2 and 20 seconds, preferably between about 2 and 4 seconds.

One skilled in the art will note that other sequences in addition to the one described above are possible to practice this invention. For example, the short temperature soak step may be skipped altogether, or it may merge with the short plasma cycle. The short plasma cycle may be skipped also. One skilled in the art will note that a short plasma cycle before film deposition will help heat the wafer if the station 1 temperature soak is relatively short and it will also help prepare the wafer surface for better adhesion properties. If the temperature soak step merges with the short plasma cycle, then steps (315) and (317) will merge. Purge gas other than oxygen may still be used in addition to oxygen, but the purge gas will be off before the reactant process gas starts to flow. The time ranges presented above for all the various steps are merely examples of ranges and durations of certain steps may fall outside the listed ranges when appropriate for a given application.

After deposition, the reactant process gas turns off (327). There is a delay before the plasma is extinguished (329). This delay will help burn off excess reactant process gas in the station so reactant gas will not diffuse to other stations where it may condense and cause defects. In some instances, this delay may be skipped—the plasma may be extinguished at the same time as the reactant process gas stops. After the plasma is extinguished, the wafer indexes to the next station (331) where the deposition process may repeat. In some embodiments, the chamber pumps down for about 0.5 to 7 seconds before the wafer indexes. This pumping down helps remove all residual unreacted process gas and prevent diffusion of these particles to other stations. Deposition may take place in all of the stations in the system except for station 1, which is dedicated to temperature soak. In other embodiments, deposition may not take place in all the stations capable of running the deposition process. Although the wafer may cool down at station 4 instead, it is not preferred.

It is important to note that to reap the benefits of high throughput, multiple wafers are in the process chamber simultaneously, usually one wafer per station. As one wafer heats up in station 1, another wafer experiences deposition in station 2, and yet other wafers experience further deposition in other stations. Of course, one can also practice this invention with only one wafer in the process chamber at a time, with a big loss in throughput.

Apparatus

The present invention is preferably implemented in a plasma enhanced chemical vapor deposition (PECVD) reactor. Such a reactor may take many different forms. Generally, the apparatus will include one or more chambers or "reactors" that house more than one station and are suitable for wafer processing. Each chamber may house one or more wafers for processing. The one or more chambers maintain the wafer in defined stations (with or without motion within that station, e.g. rotation, vibration, or other agitation). In one embodiment, a wafer undergoing deposition is transferred from one station to another within a reactor chamber during the process. For example, for a 300 Å film deposition, 100 Å of film may be deposited at each of three of four stations in accordance with the present invention. Of course, the full film deposition may occur entirely at a single station or any fraction of the total film thickness may be deposited at any number of stations.

While in process, each wafer is held in place by a pedestal, wafer chuck and/or other wafer holding apparatus. In a preferred embodiment of the invention, a Vector™ (e.g., C3 Vector) or Sequel™ (e.g., C2 Sequel) reactor, produced by Novellus Systems of San Jose, Calif., may be used to implement the invention.

Figure 4:
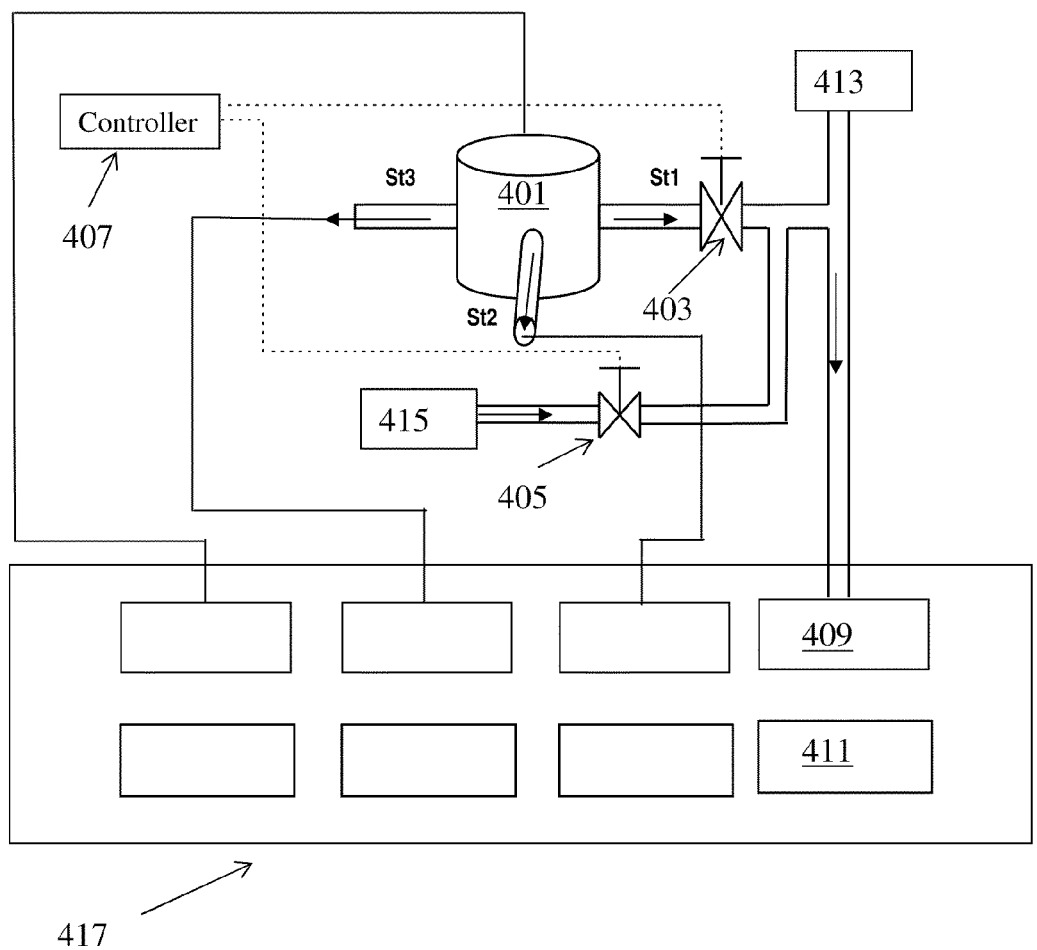
FIG. 4 is a schematic illustration showing an apparatus suitable for practicing the present invention.

FIG. 4 provides a simple block diagram depicting one arrangement of various reactor components for implementing the present invention. As shown, a process chamber 417 encloses other components of the reactor and serves to contain the plasma generated by a capacitor type system including a showerhead 409 working in conjunction with a grounded pedestal 411. A plasma source 413 including high-frequency RF generator connected to a matching network and a low-frequency RF generator is connected to showerhead 409. The power and frequency supplied by matching network is sufficient to generate a plasma from the process gas. The reactor 417 contains more than one station, although only station 1 is depicted for simplicity purposes. Station 2-4 is almost the same except that they don't have valve 403 and 405 connecting to them.

At each station, a pedestal 411 supports a wafer. The pedestals are typically equipped with a transfer plate, carrier rings, lift pins, or a combination of these to hold and transfer the substrate during and between the deposition steps and/or temperature soak step. The pedestal may be an electrostatic chuck, a resistively heated pedestal or various other types of chucks as are available for use in the industry and/or research.

Multiple source gas lines (not shown) are connected to a mixing bowl 401. The gases may be premixed or not. From the mixing bowl 401, gas flows outward to showerheads at each station. An isolation valve 403 isolates station 1 from mixing bowl output when station 1 is dedicated to temperature soak. Purge gas flows from a source 415 to a control valve 405. The control valve 405 regulates the amount of purge gas that will flow to the station 1 showerhead. In another embodiment, a three-way valve is used instead of the isolation valve 403 and control valve 405. The three-way valve is connected between the showerhead of station 1, the mixing bowl, and a purge gas source.

A controller 407 controls the operations of the entire system, including process sequence, power, flow rates, closing and opening of valves, and wafer indexing. To dedicate station 1 to temperature soak, the controller would close the isolation valve 403 and regulate the purge gas flow via control valve 405. In another embodiment, the controller would allow only a certain purge gas flow through the three-way valve to the showerhead.

The controller may also contain instructions for (1) introducing the semiconductor substrate to a first station of the deposition chamber; (2) heating the semiconductor substrate in the first station while flowing a purge gas over the substrate; (3) moving the semiconductor substrate from the first station to a second station; (4) flowing the reactant process gas onto the semiconductor substrate while positioned in the second station, thereby depositing the material on the semiconductor substrate; (5) moving the wafer one or more additional times; and (6) removing the wafer from the deposition chamber. The controller instructions may be implemented as hardware, software, firmware, or any combination thereof. These instructions are configured for execution on a processor contained within the controller.

Although the instructions above pertain to a single wafer, the controller is capable of and does simultaneously performing these instructions to different wafers at different stations.

Experimental

As mentioned previously, the present invention is effective at producing low-defect TEOS oxide films at high throughput without sacrificing film quality.

The invention was validated with a marathon run of 1500 wafers. A Vector system was modified with the appropriate valves and controller instructions. Argon purge gas flowed to station 1 at 4500 sccm for a three second temperature soak while TEOS process gas flowed to stations 2-4. Five hundred wafers were processed in 5.15 hours, followed by a chamber cleaning for 0.17 hours. The net throughput for these wafers is 94 wafers per hour, well above the throughput of 73 wafers per hour without this invention. The throughput gain of 21 wafers per hour, or 29% improvement, is a very significant improvement and achieved with little hardware change and without adding any high-speed mechanical device.

Figure 5A:
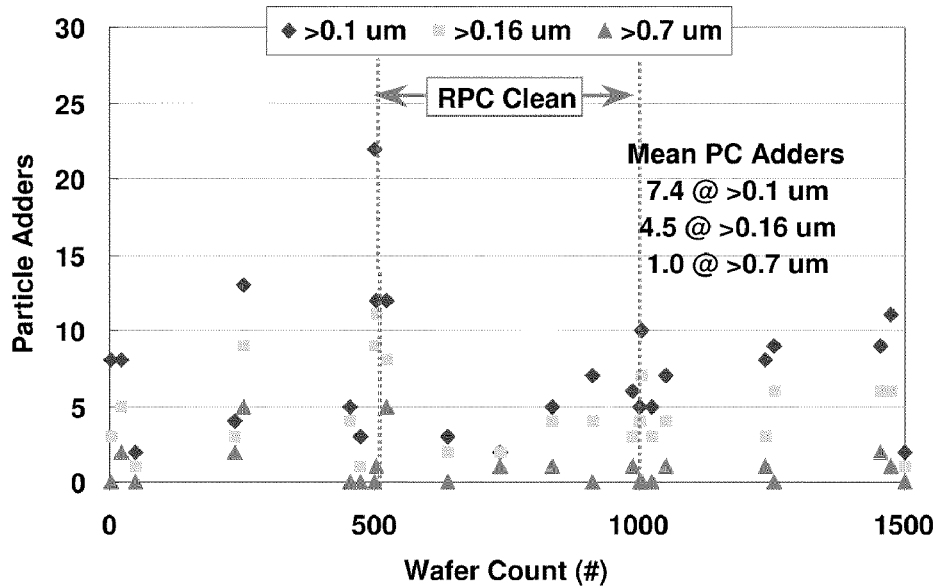
FIG. 5A is a graph showing the number of particles in TEOS oxide films deposited using Argon as the purge gas in station 1 temperature soak.
Figure 5B:
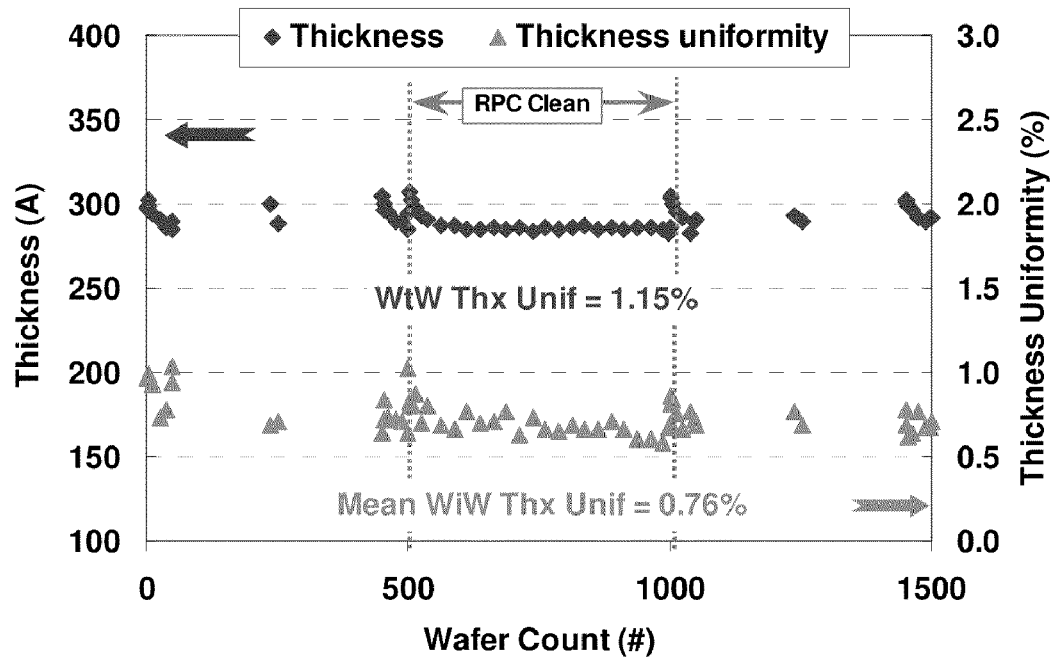
FIG. 5B is a graph showing the film thickness and film thickness uniformity deposited across 1500 wafers using Argon as the purge gas in station 1 temperature soak.

FIG. 5A shows the number of defects by size for various wafers. The mean number of defects greater than 0.1 microns was 7.4, below the number of defects found in FIG. 1, even after 9 seconds of temperature soak. FIG. 5B shows the thickness and thickness uniformity deposited in 1500 wafers. The wafer-to-wafer thickness uniformity was 1.15%, and the mean within-wafer thickness uniformity was 0.76%. In other words, the film thickness as compared between wafers varied only 1.15%, and the film thickness as compared between different points on the wafer varied only 0.76%. The low variance shows that the invention does not adversely affect film property. The marathon results establish that the invention, as practiced in the example, minimized small bin defects while increasing throughput and maintaining good film quality.

Although various details have been omitted for clarity's sake, various design alternatives may be implemented. Therefore, the present examples are to be considered as illustrative and not restrictive, and the invention is not to be limited to the details given herein, but may be modified within the scope of the appended claims.

What is claimed is:

1. A multi-station sequential deposition apparatus for depositing a material on a semiconductor substrate, the deposition apparatus comprising:
   a first station for heat soaking the semiconductor substrate without depositing the material;
   one or more additional stations for depositing the material on the semiconductor substrate; and
   a controller comprising instructions for
   introducing the semiconductor substrate to a first station of the deposition chamber;
   heating the semiconductor substrate in the first station while flowing a purge gas over the substrate, wherein the purge gas is substantially free of a reactant process gas being delivered in other stations of the deposition chamber and wherein no reactant gas flows to the substrate through the showerhead at the first station while the substrate is in the first station;
   moving the semiconductor substrate from the first station to a second station;
   flowing the reactant process gas onto the semiconductor substrate while positioned in the second station, thereby depositing the material on the semiconductor substrate;
   and removing the semiconductor substrate from the deposition chamber.

2. The apparatus of claim 1, further comprising showerheads in each station connected to a mixing bowl that is connected to a gas source, and
   a plasma source also connected to the showerheads.

3. The apparatus of claim 1, further comprising an isolation valve connected between the showerhead of station 1 and the mixing bowl, and
   a control valve connected to a purge gas source and a gas line between the isolation valve and the showerhead, wherein the controller controls both valves.

4. The apparatus of claim 1, further comprising a three-way valve connected between the showerhead of station 1, the mixing bowl, and a purge gas source, wherein the controller controls the three-way valve.

5. The apparatus of claim 1, wherein the controller comprises instructions for simultaneously performing the heating instruction at the first station and the depositing instruction at the other stations on different semiconductor substrates.

6. The apparatus of claim 1, wherein the controller further comprises instructions for flowing purge gas substantially free of the reactant process gas over semiconductor substrates in the one or more other stations for a period of no more than about 6 seconds while flowing the purge gas over the substrate in the first station.

7. The apparatus of claim 1, wherein the controller further comprises instructions for igniting a plasma in the one or more other stations without igniting a plasma in the first station.

8. The apparatus of claim 1, wherein the controller further comprises instructions for igniting a plasma in the first station to heat the wafer.

9. The apparatus of claim 1, wherein the controller further comprises instructions for stopping the flow of reactant process gas over semiconductor substrates in the one or more other stations before extinguishing the plasma.

10. The apparatus of claim 1, wherein the controller further comprises instructions for moving the substrate one or more additional times.

11. The apparatus of claim 1, wherein the controller further comprises instructions for simultaneously heating a semiconductor substrate in the first station and depositing the material on a different semiconductor substrate in the second station.

12. The apparatus of claim 1, wherein the controller further comprises instructions for heating the semiconductor substrate in the first station without igniting a plasma in the first station.

13. A multi-station sequential deposition apparatus for depositing a material on a semiconductor substrate, the deposition apparatus comprising:
- a first station for heat soaking the semiconductor substrate without depositing the material;
- one or more additional stations for depositing the material on the semiconductor substrate; and
- a controller comprising instructions for
- introducing the semiconductor substrate to a first station of the deposition chamber;
- heating the semiconductor substrate in the first station while flowing a purge gas over the substrate, wherein the purge gas is substantially free of a reactant process gas being delivered in other stations of the deposition chamber;
- moving the semiconductor substrate from the first station to a second station without depositing the material in the first station;
- flowing the reactant process gas onto the semiconductor substrate while positioned in the second station, thereby depositing the material on the semiconductor substrate;
- and removing the semiconductor substrate from the deposition chamber.

* * * * *